Figure 1:
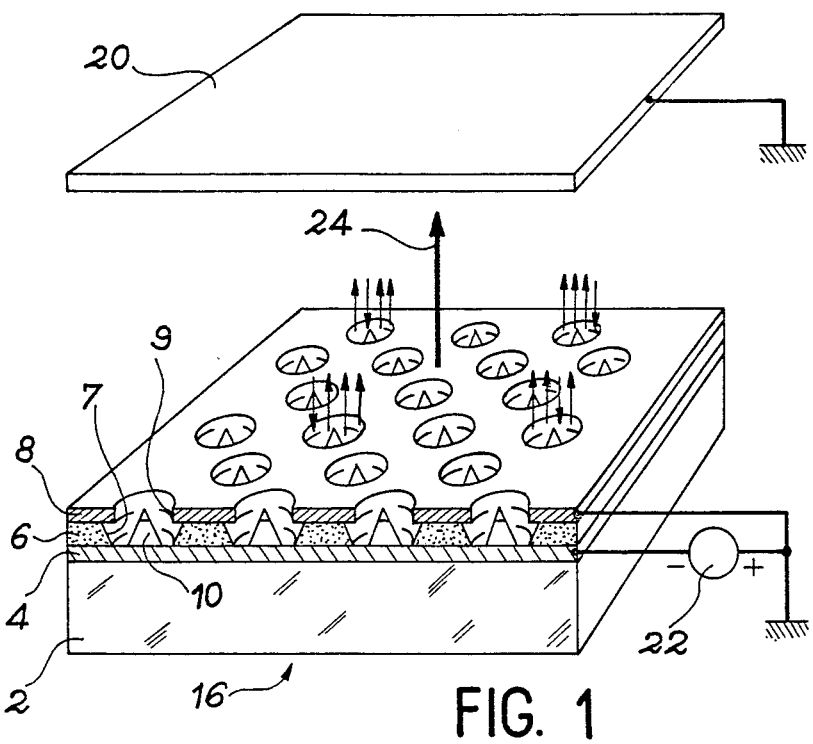

United States Patent [19]

Baptist et al.

[11] Patent Number: 4,835,438

[45] Date of Patent: May 30, 1989

[54] SOURCE OF SPIN POLARIZED ELECTRONS USING AN EMISSIVE MICROPOINT CATHODE

[75] Inventors: Robert Baptist, Jarrie; Ariel Brenac, Echirolles; Gérard Chauvet, Grenoble; Robert Meyer, Ismier; Francis Muller, Seyssinet, all of France

[73] Assignee: Commissariat a l'Energie Atomique, Paris, France

[21] Appl. No.: 125,135

[22] Filed: Nov. 25, 1987

[30] Foreign Application Priority Data

Nov. 27, 1986 [FR] France ................................. 86 16553

[51] Int. Cl.$^4$ ............................................... H01J 1/02
[52] U.S. Cl. .................................... 313/309; 313/351; 313/336; 313/156; 313/157
[58] Field of Search ......... 313/309, 351, 336, 153–157; 250/423 F, 492.3

[56] References Cited

U.S. PATENT DOCUMENTS 3,921,022 11/1985 Levine ................................. 313/309
4,513,308 4/1985 Greene et al. .................. 313/310 X

FOREIGN PATENT DOCUMENTS 0172089 2/1986 European Pat. Off. .

OTHER PUBLICATIONS

Applied Physics, vol. 14, No. 2, Oct. 1977, pp. 149–153; G. Baum et al: "Field Emission of Monoenergetic Spin-Polarized Electrons".

Primary Examiner—Palmer C. DeMeo
Assistant Examiner—Michael Horabik

[57] ABSTRACT

Spin polarized electron source using an emissive micropoint cathode. At least one portion of each micropoint, including the top of the latter, is ferromagnetic, so that the electrons emitted by the cathode are spin polarized in a given direction, when the portion is subject to a magnetic field parallel to the given direction.

10 Claims, 3 Drawing Sheets

SOURCE OF SPIN POLARIZED ELECTRONS USING AN EMISSIVE MICROPOINT CATHODE

The present invention relates to a source of spin polarized electrons using an emissive micropoint cathode. It more particularly applies to the physics of electron-matter and more especially to the physics of surfaces, the physics of electron-particle interactions (atoms, ions, subatomic particles), to plasma physics and to electron microscopy.

Spin polarized electron sources are already known, which use a gallium arsenide layer covered with a cesium layer. A spin polarized electron beam is obtained by luminating the surface of the cesium layer by a light from a laser having a clearly defined energy, said light also being circularly polarized. Such sources are known from: the article by S. Alvarado et al, in the book entitled "Photoemission and the electronic properties of surfaces", published under the direction of B. Feuerbacher et al, John Wiley and Sons, 1978, the article by H. J. Drounin et al, Courrier du CNRS, Supplement, de la Physique No. 59, 1985, p 86, the article by D. T. Pierce et al, Rev. of Sci. Instr. 51(4), 1980, p 478, the article by G. Lampel, Phys. Rev. Lett., 20, 1968, p 491, the article by H. C. Siegmann et al, Phys. Rev. Lett., vol. 46, No. 6, 1981, p 452.

These sources suffer from the following disadvantages. They require complicated and large equipment (electric power supply, laser, etc.). The carrying out of cesium deposition is a difficult operation which has to be performed under an ultra-high vacuum (at least $10^{-8}$Pa).

The cesium deposit must be frequently repeated in order to retain the physical characteristics of the electron beam (polarization rate of approximately 50%, electron current of a few dozen microamperes for an energy dispersion of approximately 0.3 eV). The intensity of the electron beam obtained is low. Finally, the electrons have spins which are parallel or anti-parallel to their trajectory at the time when they leave the cesium layer.

Other spin polarized electron sources are known, which use a macroscopic tungsten point covered with a fine film (approximately 50 nanometers thick) of an insulating material which is ferromagnetic at very low temperature, such as EuS. By raising the point to a voltage of several kV with respect to an anode and subjecting the point to a magnetic field parallel thereto, electrons are extracted from the latter by field effect and acquire, on passing through the Eus layer, a spin polarization. These other sources are in particular known from: the article by E. Kisker et al, Phys. Rev. Lett., vol. 36, No. 16, 1976, p 982, the article by G. Baum et al, Applied Physics, 14, 1977, p 149.

Such sources also suffer from the following disadvantages. They require voltages of approximately 1 kV and therefore large installations. The electron currents obtained with these sources have very low intensities of approximately $10^{-8}$ A (with an energy resolution of approximately 100 meV and a polarization rate up to 85% for a temperature of 9° K).

The object of the present invention is to obviate these disadvantages by proposing a source of spin polarized electrons, which can be realized in a relatively simple, durable, relatively small and lightweight manner (which makes it possible to place it on board a satellite), which makes it possible to obtain intense electron beams (which is of interest for certain plasma physics applications), whilst retaining correct energy resolution and polarization rate. Moreover, in certain constructions, it makes it possible to obtain electrons, whose spins are perpendicular to the trajectory thereof (other constructions making it possible to obtain electrons, whose spins are parallel to the trajectory thereof). For this purpose, the present invention uses a micropoint emissive cathode of a particular type.

Micropoint emissive cathodes are already known from U.S. Pat. Nos. 3,755,704, 3,921,022, FR A-2443085 and French patent application No. 8411986 of 7 27 1984 (or U.S. patent application Ser. No. 177,880 filed Mar. 24, 1988, a continuation application of U.S. patent application Ser. No. 758,737 of 7 25 1985).

The present invention therefore relates to a source of spin polarized electrons, characterized in that it comprises at least one first electrode, whereof one face is provided with a plurality of micropoints made from an electron emitting material and whose bases are located on said face, and at least one second electrode, which is electrically insulated from the first electrode, positioned facing said face and having holes respectively facing said bases, the top of each micropoint being positioned level with the hole corresponding thereto, so that electrons are emitted by micropoints when the latter are in vacuum and the second electrode is positively polarized with respect to the first electrode, and in that at least one portion of each micropoint, including the top thereof, is ferromagnetic, so that the emitted electrons are spin polarized in a given direction, when each portion is subject to a magnetic field parallel to said given direction.

With a density of 10,000 micropoints/mm$^2$, it is possible to obtain an electron current of approximately 100 microamperes for a voltage of approximately 80V between the first and second electrodes. The energy resolution can be approximately 0.3 to 1.3 eV.

According to a special embodiment of the invention, each portion is formed or covered by a material which is ferromagnetic at ambient temperature (i.e. approximately 20° C.). This ferromagnetic material is e.g. iron, nickel, or an alloy containing iron and nickel.

Thus, there is no need for cumbersome cooling devices of the type required for EuS-covered tungsten point sources.

In a special embodiment of the source according to the invention, corresponding to the aforementioned embodiment, the micropoints are oriented along the same axis, said source also having means for subjecting said portion to a magnetic field parallel to said axis.

The source according to the invention can comprise several parallel, elongated first electrodes and several parallel, elongated second electrodes, the first electrodes forming an angle with the second electrodes, which defines the intersection zones of the first and second electrodes, the micropoints and the holes being located in said intersection zone.

By appropriately polarizing the first and second electrodes, it is possible to select one or more given intersection zones with a view to emitting an electron beam. In this case, with the micropoints oriented in accordance with the same axis, said source can also comprise means for individually subjecting each intersection zone to a magnetic field parallel to said axis.

In a special embodiment of the source according to the invention and which also corresponds to the aforementioned embodiment, the micropoints are oriented according to the same axis, so that the second electrode has a planar layer perpendicular to the same axis and formed from a material which is ferromagnetic at ambient temperature.

In a special construction of the invention, the thickness of the planar layer is at least equal to the height of said micropoint portion, counted parallel to said axis and each micropoint portion is in the hole corresponding thereto in said planar layer.

The source can also comprise means for subjecting each micropoint portion to a magnetic field perpendicular to said planar layer or means for subjecting each micropoint portion to a magnetic field parallel to said planar layer and channelled by the latter. The field can be constant or variable, parallel to the planar layer, in direction and/or in sense and/or in intensity. For example, it is possible to obtain a rotary field parallel to the planar layer, which makes it possible to obtain spin polarized electrons, whose spin turns around the electron propagation direction.

In the latter case (field parallel to the planar layer), it is possible to obtain spin polarized electrons, whose spins are parallel to the planar layer and are therefore perpendicular to the trajectory of the electrons (which is perpendicular to said layer). Thus, it is possible to directly obtain this particular polarization of the spins, without having to use devices like electrostatic analyzers, with a view to curving the trajectory of the electrons in order to obtain such a polarization, which was in particular the case in spin polarized electron sources using gallium arsenide.

The present invention will be better understood from reading the following description of non-limitative embodiments with reference to the attached drawings, wherein show:

FIG. 1 A diagrammatic view of an embodiment of the source according to the invention.

Figure 2:
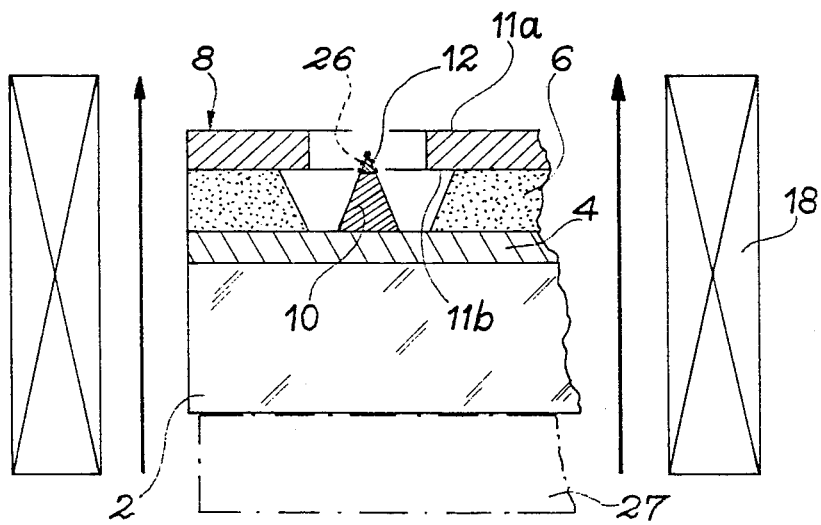

FIG. 2 A detail of the source shown in FIG. 1.

Figure 3:
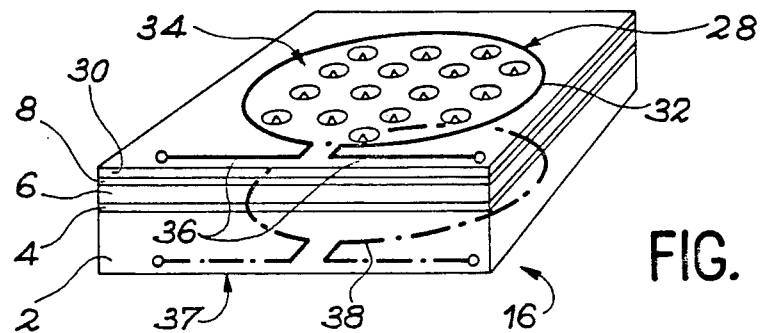

FIG. 3 A constructional variant of the source of FIG. 1.

Figure 4:
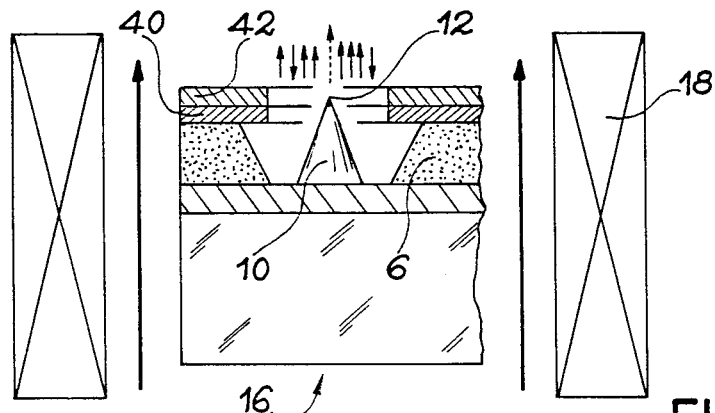

FIG. 4 A diagrammatic view of another embodiment of the source according to the invention.

Figure 5:
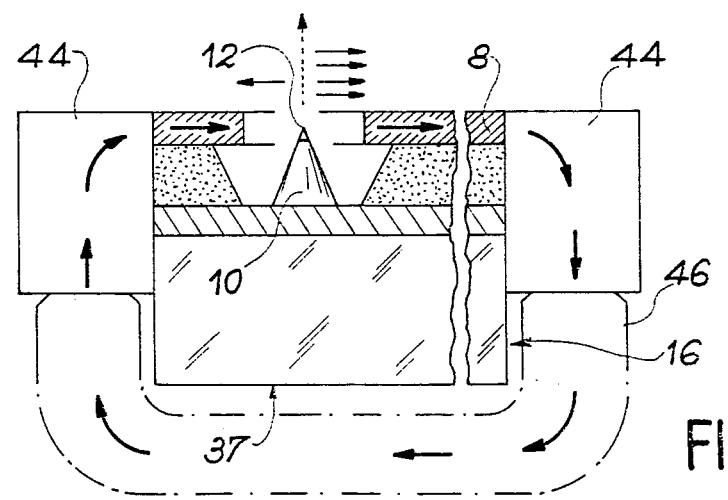

FIG. 5 A diagrammatic view of another embodiment of the source according to the invention.

Figure 6:
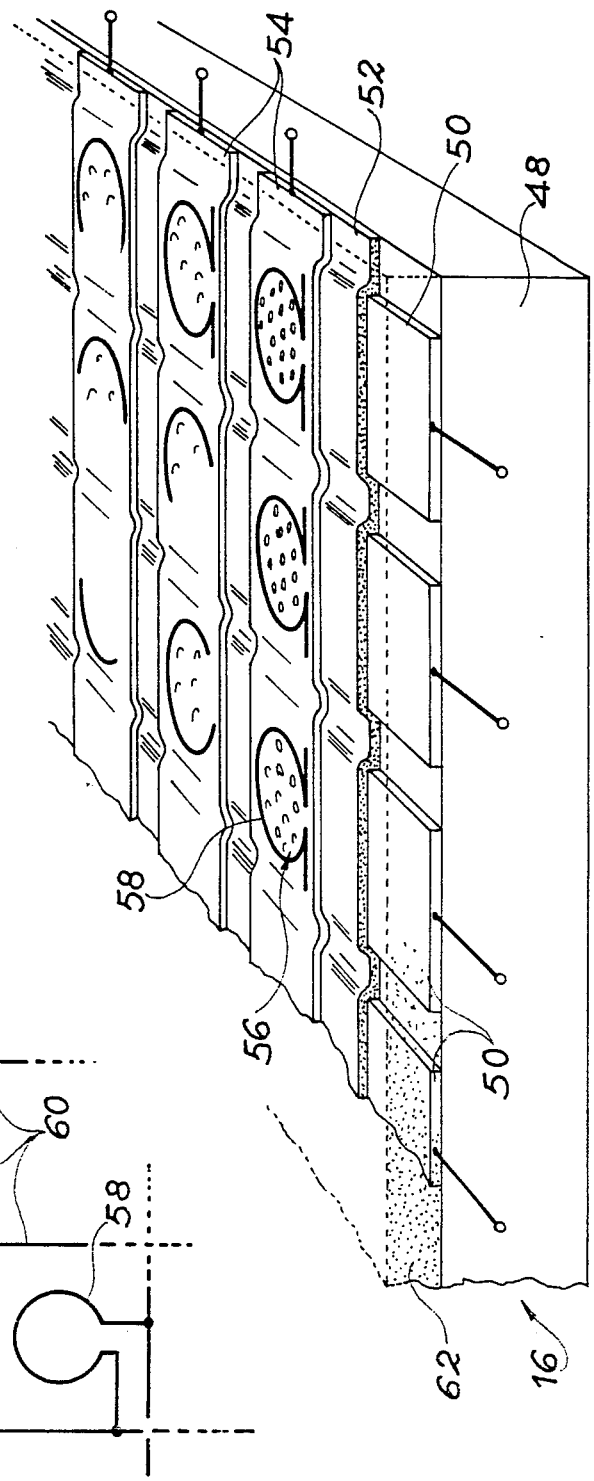

FIG. 6 A diagrammatic view of another embodiment of the source according to the invention.

Figure 7:
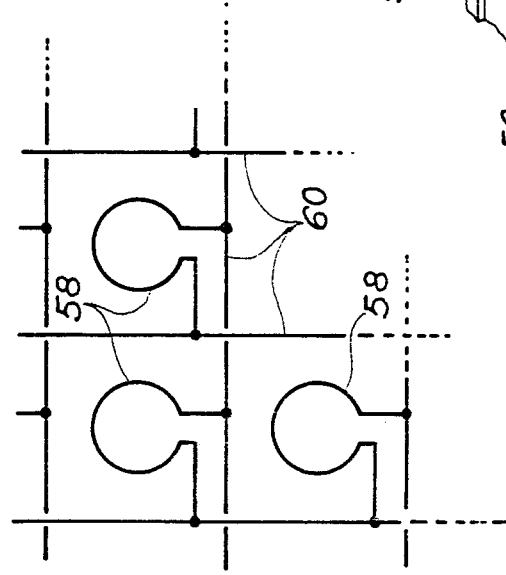

FIG. 7 A constructional variant of the source shown in FIG. 6.

FIG. 1 diagrammatically shows a special embodiment of the spin polarized electron source according to the invention having a glass substrate 2, on which is deposited an electrically insulating planar layer 6, itself covered by an electrically conductive planar layer 8, called a grid. Layers 6 and 8 have regularly spaced holes 7, 9, so that it is possible to see layer 4. In each of these holes is placed an electrically conductive, substantially conical micropoint 10, which rises from layer 4 in the direction of layer 8 and whereof the top or apex is located between the surface level 11a of layer 8 and the base level 11b of said layer 8.

Micropoints 10 can be made from a material which is ferromagnetic at ambient temperature. As a variant, a portion 12 of each micropoint (FIG. 2), said portion including the top thereof, is made from a material which is ferromagnetic at ambient temperature, whilst the rest of the micropoint is made from an electrically conductive material.

The height of said portion 12 is adjusted at the time of producing the micropoints. This adjustment can be carried out in such a way as to produce portions 12 with a sufficiently small volume so that, beneath the magnetic field, portions are obtained only having a single magnetic monodomain (WEISS domain).

In a purely indicative and non-limitative manner, layer 4 is of $In_2O_3$ or Si, highly N or P doped and with a thickness of approximately 150 nanometers. Layer 6 is of $SiO_2$ and has a thickness of approximately 1 micrometer. Layer 8 is made from molybdenum or niobium and has a thickness of approximately 0.4 micrometer. Holes 9 of layer 8 have a diameter of approximately 1.5 micrometer. Micropoints 10 have a height of approximately 1.4 micrometer and a base with a diameter of approximately 1 micrometer. Micropoints 10 are of molybdenum, except in their ferromagnetic portion 12, which is made from iron and has a height of approximately 20 to 30 nanometers.

The micropoint emitting cathode 16 obtained in this way is placed in a magnetic field perpendicular to the plane of layer 8 and is e.g. obtained by means of a magnetic coil 18 (FIG. 2), in which is placed the emissive cathode 16 in such a way that layer 8 is perpendicular to the axis of the coil (which is thus parallel to the axes of the micropoints).

For example, it is wished to study the interaction of the electrons which the emissive cathode 16 is able to emit under certain polarization conditions with a sample 20. Thus, the assembly incorporating the coil, the cathode and the sample is placed under vacuum and layer 4 and consequently micropoints 10 are raised to a negative potential compared with layer 8, which can be at earth or ground, by means of an appropriate source 22, whereby sample 20 can be earthed or grounded or raised to a positive potential with respect to layer 8 by means of a not shown source.

For example, by applying a voltage of approximately 80V between layers 4 and 8, electrons are emitted by micropoints 10 in a direction 24 perpendicular to layer 8. Due to the presence of ferromagnetic portions 12, the electrons are spin polarized and thus, in most cases, have spins parallel to direction 24 and of the same sense as the magnetic field produced (the spins being oriented from layer 8 to sample 20 in the particular case of FIGS. 1 and 2).

Instead of producing micropoints 10 with a ferromagnetic portion 12, it would be possible to make these micropoints from a non-ferromagnetic material and provide them with a layer 26 of a metal which is ferromagnetic at ambient temperature and which at least partly covers each micropoint as from the tip thereof.

Layers 26 are e.g. deposited by vacuum evaporation through a not shown mask and placed against layer 8 and having several openings coaxial to the micropoints and with a diameter at least equal to the diameter of the holes in layer 8.

In order to produce the magnetic field, it could also be possible to envisage producing layer 8 from a ferromagnetic material able to constitute a permanent magnet, following magnetization in a magnetic field perpendicular to layer 8, said material e.g. being a samarium-cobalt alloy.

FIG. 3 diagrammatically shows a source according to the invention, which differs from that of FIGS. 1 and 2 by the fact that into the emissive cathode 16 have been integrated means 28 making it possible to produce a magnetic field perpendicular to conductive layer 8. The latter is covered by an electrically insulating layer 30, e.g. of silica and which e.g. has a thickness of approximately 1 micrometer and has holes coaxial to micropoints 10 and with a diameter substantially equal to that of the holes 9 of layer 8. An electrode 32 is formed on layer 30 and surrounds all the holes formed in said layer 30.

Electrode 32 is e.g. in the form of a thin, narrow film of a metal such as aluminium, which is deposited on the surface of layer 30 and which substantially adopts the shape of a capital omega within the loop of which is located all the holes made in layer 30 and whose free ends 36 serve as current supplies so that, as a result of the loop of the omega which forms a turn, a magnetic field is produced perpendicular to the plane of layers 8 and 30.

It is also possible to deposit on the free face 37 of glass layer 2 another conductor 38, e.g. of aluminium, which has the same shape and dimensions as conductor 32 and is perpendicular to the latter, so that by passing currents of appropriate directions into conductors 32 and 38, a more intense magnetic field is obtained than when using only conductor 32.

FIG. 4 diagrammatically shows another embodiment of the source according to the invention. This embodiment essentially differs from that of FIG. 1 and 2 by the fact that the non-ferromagnetic conductive layer 8 is replaced by a conductive, non-ferromagnetic layer 40, e.g. of molybdenum and with a thickness of 100 nanometers, said layer 40 being deposited on insulating layer 6 and surmounted by another conductive layer 42, which is ferromagnetic at ambient temperature, e.g. of iron or a cobalt-chromium alloy and having a thickness of 100 nanometers. Obviously, layers 40 and 42 have holes passing through both of them, which have the same diameter as holes 14 and which are coaxial to the micropoints 10, whose tips are flush with the surface of layer 42.

To the emissive cathode 16 shown in FIG. 4 are added means making it possible to produce a magnetic field perpendicular to layer 42, e.g. a magnetic coil 18 surrounding emissive layer 16, as explained relative to FIG. 2, so that it is possible to magnetize layer 42 perpendicular to its plane, which induces a magnetization of micropoints 10 (incorporating all the ferromagnetic portions 12) perpendicular to the plane of layers 40 and 42. When operating under vacuum, this leads to an electron beam perpendicular to the plane of layer 40, the spins of the electrons being largely perpendicular to said plane and oriented in the sense of the magnetic field produced.

FIG. 5 diagrammatically shows an advantageous embodiment of the source according to the invention, which essentially differs from the embodiment of FIGS. 1 and 2 by the fact that layer 8 is conductive and ferromagnetic at ambient temperature. It is e.g. a 0.4 micrometer thick iron layer. Two conductive, ferromagnetic tabs 44, e.g. of iron are positioned against two opposite lateral faces of emissive cathode 16. These tabs 44 are in contact with ferromagnetic layer 8 and are e.g. welded thereto. Tabs 44 do not project beyond the surface of layer 8 and have dimensions which do not exceed the dimensions of the emissive cathode 16 against which they are located.

A small, U-shaped permanent magnet 46 is positioned beneath the free face 37 of the glass layer of emissive cathode 16 and the poles of said magnet are respectively connected to the two tabs 44. Magnet 46, tabs 44 and the ferromagnetic layer consequently form a magnetic circuit. The respective dimensions of tabs 44 and magnet 46 are chosen so that all the leins of force of the magnetic field are channelled through the ferromagnetic layer 8 and do not pass above the surface of said layer 8.

In the latter, the magnetization is parallel to the plane of the ferromagnetic layer 8. Obviously, each micropoint 10 also comprises the ferromagnetic portion 12. When operating under vacuum, the electrons are emitted perpendicular to the plane of layer 8, but the spins of the electrons are now largely parallel to the plane of layer 8, because of the magnetization direction of layer 8 and are oriented in accordance with the sense of the magnetic field present in layer 8.

Obviously, the construction described with reference to FIG. 5 is adaptable to the emissive cathode 16 described relative to FIG. 4 by forming the magnetic circuit with layer 42, tabs 44 and magnet 46, as was explained in connection with layer 8, or tabs 44 and magnet 46 relative to the description of FIG. 5.

In a purely indicative and non-limitative manner, in plan view layer 8 (FIG. 5) is a 1 cm square, in the centre of which the micropoints are grouped in a square region of 1 mm side dimension and each tab 44 adopts the shape of a cube with a side dimension between 1 and 10 mm. Moreover, magnet 46 can be replaced by an electromagnet having a core with the same shape as magnet 46 and disposed in the same way as the latter, as well as a coil surrounding the core (e.g. under said free face 37).

To this electromagnet can be added another identical electromagnet, associated with two tabs identical to tabs 44, but respectively located against the two other opposite lateral faces of the emissive cathode (which viewed in plan view can be square-shaped) and in contact with the ferromagnetic layer 8 (FIG. 5), whilst not projecting beyond the surface of the latter and having dimensions such that they do not pass beyond the sides of the emissive cathode against which they are located. By varying the supply currents of the electromagnets, it is also possible to vary the direction and/or sense and/or intensity of the magnetic field in layer 8. For example, it is possible to provide a field rotating parallel to said layer, which rotates the spin of the electrons around the trajectory thereof.

FIG. 6 diagrammatically shows another embodiment of the source according to the invention, in which the emissive cathode 16 has a matrix structure. More specifically, on a glass plate 48 are deposited a plurality of parallel, conductive strips 50. An insulating layer 52, e.g. of silica, covers said strips 50. A plurality of other parallel, conductive strips 54, perpendicular to strips 50, are deposited on insulating layer 5. In the "intersection" zones 56 of strips 50 and 54, strips 54 and layer 52 have holes and strips 50 have micropoints like the micropoints 10 with a ferromagnetic portion 12 according to FIG. 1, which rest on strips 50 and are flush with strips 54. In a purely indicative and non-limitative manner, strips 50 have a width of approximately 0.1 to 1 mm, a thickness of approximately 1 micrometer and are reciprocally spaced by approximately 10 micrometers to 0.1 mm. In the same way, strips 54 have a width of approximately 0.1 to 1 mm, a thickness of approximately 1 micrometer and are reciprocally spaced by 10 micrometers to 0.1 mm.

When the emissive cathode 16 is placed under vacuum, it is clear that an appropriate polarization of strips 50 and 54 makes it possible to obtain electron beams for given zones 56. For example, the negative polarization of a given strip 50 with respect to a given strip 54 makes it possible to obtain, when the cathode is in vacuum, an electron beam emitted by the micropoints of zone 56 corresponding to the intersection of said given strips 50, 54.

By also placing the cathode in a magnetic field perpendicular to the plane of layers 54, the electrons emitted by the selected zone or zones 56 are spin polarized, as explained relative to FIGS. 1 and 2 (due to the use of micropoints with a ferromagnetic portion).

It is also possible to envisage surrounding each zone 56 with a conductor 58 shaped like a capital omega, as explained relative to FIG. 3. This gives a network of such conductors 58, which are provided with appropriate connection lines 60 (FIG. 7), so as to be able to effect a matrix addressing of conductors 58. Conductors 58 and lines 60 are obviously placed in an insulating layer 62, e.g. of silica, which is deposited on all the strips 54.

It is therefore possible to produce a magnetic field in a given zone 56, said field being perpendicular to the considered zone 56, so that the electron beam emitted by said zone is spin polarized. Simple or matrix structure, micropoint emissive cathode production processes are known from the prior art.

A description is given hereinafter of a process making it possible to obtain a matrix structure cathode and which comprises the following stages:

deposition, by cathodic sputtering, of a first indium oxide conductive layer on an insulating substrate (covered glass plate by cathodic sputtering of $SiO_2$); etching the first layer (through a positive resin mask and by chemical etching with orthophosphoric acid at 110° C., the mask then being eliminated by chemical dissolving), to form first parallel conductive strips; deposition of a second insulating $SiO_2$ layer on the structure obtained (by chemical vapour phase deposition from silane, phosphine and oxygen);

deposition of a third conductive layer of niobium on the second layer (by vacuum evaporation);

forming holes issuing into the third and second layers, said holes being distributed over the entire surface of the third and second layers and are formed through an appropriate resin mask (obtained by photolithography) representing the positive image of the holes, by reactive ionic etching by $SF_6$ of the third layer, chemical etching using a solution of HF and $NH_4F$ of the second layer and then eliminating the mask;

deposition on the third etched layer of a fourth layer not covering the holes (by vacuum evaporation of nickel, under a glancing incidence of 15° relative to the surface of the structure);

deposition on the complete structure obtained of a fifth layer of an electron emitting material such as molybdenum, under normal incidence with respect to the structure surface;

elimination, by selective dissolving using an electrochemical process, of the fourth layer leading to the elimination of the electron emitting material surmounting said layer and maintaining said emitting material in the holes;

etching (through an appropriate resin mask obtained by photolithography) of the third and second layers in order to expose at least one of the ends of the first conductive strips permitting electric contacting; and etching the third layer to form second parallel conductive strips, the first and second strips intersecting, said etching consisting of reactive ionic etching using $SF_6$ through a resin mask obtained by photolithography and eliminated by chemical etching once said reactive ionic etching is finished.

In order to form said ferromagnetic portions 12 used in the present invention, the aforementioned process is modified in the following way. The deposition of the fifth layer can be performed by the vacuum evaporation of an appropriate material and the duration thereof is controlled. Thus, it is possible to interrupt said evaporation when an adequate height of the micropoints (then having a truncated cone shape) is obtained and the evaporation is continued with a conductive material which is ferromagnetic at ambient temperature, so as to obtain conical micropoints with a ferromagnetic portion.

For example, said fifth layer is obtained by the vacuum evaporation of a material such as molybdenum or niobium for an appropriate time, so as to obtain truncated coneshaped elements of the desired height and this is followed by the vacuum evaporation of a material such as iron (or better still an iron-nickel compound, e.g. $Fe_{0.2}-Ni_{0.8}$) for a given time, so as to complete the elements for obtaining the conical micropoints.

The inventive embodiment in which layer 8 is a samarium-cobalt alloy is obtained by the indicated process, in which said third layer is made from a samarium-cobalt alloy. When the corresponding emissive cathode is obtained, it is heated under vacuum whilst negatively polarizing the micropoints with respect to said layer 8, so as to carry out a heat treatment thereof making it possible to improve its ferromagnetic properties.

By then placing the emissive cathode 16 in a magnetic field parallel to the samarium-cobalt alloy layer, the latter is permanently magnetized.

The construction described relative to FIG. 3 requires a complimentary stage for forming the silica layer 30. For this purpose, a silicon layer is placed on layer 8 through an appropriate mask preventing the deposition of silicon at the location of the holes and the deposited silicon is oxidized. The aluminium layer 32 can be deposited through an appropriate mask.

The construction of FIG. 4 makes it necessary to replace the deposit of the third layer by a double deposit, namely a first deposit of a layer of e.g. molybdenum, followed by a deposit of e.g. iron.

The present invention can be used:

in studies of electron diffraction, reverse photoemission, auger spectroscopy, electron microscopy (by having electrostatic optics following the electron source so as not to interfere with the magnetic field necessary for the source);

in the study of interactions of electrons with subatomic particles, atoms, molecules or ions and in particular in plasma physics, in which the invention can make it possible to ionize atoms or molecules and bring them into excited electron states of a particular type, with a view to assisting a given chemical reaction, which is very difficult if not impossible to perform with the prior art spin polarized electron sources, which do not make it possible to obtain sufficiently intense electron beams for this purpose;

for reading informations recorded in a ferromagnetic material, which has the property of selectively absorbing a spin polarized electron beam, the absorbed part being dependent on the magnetization intensity of the material at the beam impact point;

in the space field, the source according to the invention being realizable with a low weight and small overall dimensions, whilst being usable in space vacuum.

We claim:

1. A source of spin polarized electrons comprising: at least one first electrode having one face provided with a plurality of micropoints of an electron emitting material and having bases located on said face; and at least one second electrode electrically insulated from said first electrode, positioned so as to face said face and having holes respectively facing said bases, each micropoint having a top positioned level with the hole corresponding thereto, so that electrons are emitted by said micropoints when the latter are in a vacuum and said second electrode is positively polarized with respect to said first electrode, and at least one portion of each micropoint, including the top thereof, being ferromagnetic, so that the emitted electrons are spin polarized in a given direction, when said at least one portion is subject to a magnetic field parallel to said given direction.

2. A source according to claim 1, wherein said at least one portion is formed or covered by a material which is ferromagnetic at ambient temperature.

3. A source according to claim 1, wherein said material ferromagnetic at ambient temperature is chosen from the group consisting of iron, nickel, and alloys containing iron and nickel.

4. A source according to claim 1, wherein the micropoints are oriented in accordance with the same axis, said source also comprising means for subjecting said at least one portion to a magnetic field parallel to said axis.

5. A source according to claim 1, comprising several parallel, elongated first electrodes and several parallel, elongated second electrodes, said first electrodes being arranged at angles with respect to said second electrodes such that they define intersection zones of the first and second electrodes, the micropoints and holes being located in said intersection zones.

6. A source according to claim 5, wherein said micropoints are oriented in accordance with the same axis, said source also comprising means for individually subjecting each intersection zone to a magnetic field parallel to said axis.

7. A source according to claim 2, wherein said micropoints are oriented in accordance with the same axis, said second electrode having a planar layer perpendicular to said same axis and consisting of a material which is ferromagnetic at ambient temperature.

8. A source according to claim 7, wherein the thickness of said planar layer is at least equal to the height of said at least one portion parallel to said axis, said at least one portion being located in the hole corresponding thereto in said planar layer.

9. A source according to claim 7, comprising means for subjecting said at least one portion to a magnetic field perpendicular to said planar layer.

10. A source according to claim 7, comprising means for subjecting said at least one portion to a magnetic field parallel to said planar layer and channelled by the latter.

* * * * *